United States Patent
Liu et al.

(10) Patent No.: US 9,066,431 B2
(45) Date of Patent: Jun. 23, 2015

(54) METHOD FOR MANUFACTURING PRINTED CIRCUIT BOARD WITH PATTERNED ELECTRICALLY CONDUCTIVE LAYER THEREIN VISIBLE

(71) Applicants: FuKui Precision Component (Shenzhen) Co., Ltd., Shenzhen (CN); Zhen Ding Technology Co., Ltd., Taoyuan (TW)

(72) Inventors: Rui-Wu Liu, Shenzhen (CN); Ming-Jaan Ho, Taoyuan (TW); Xian-Qin Hu, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 28 days.

(21) Appl. No.: 13/953,881

(22) Filed: Jul. 30, 2013

(65) Prior Publication Data

US 2014/0027164 A1  Jan. 30, 2014

(30) Foreign Application Priority Data

Jul. 30, 2012 (CN) .......................... 2012 1 0266463

(51) Int. Cl.
| | |
|---|---|
| H05K 3/02 | (2006.01) |
| H05K 3/10 | (2006.01) |
| H05K 1/02 | (2006.01) |
| H05K 3/00 | (2006.01) |
| H05K 3/06 | (2006.01) |
| H05K 3/26 | (2006.01) |
| H05K 1/09 | (2006.01) |

(52) U.S. Cl.
CPC .. *H05K 1/09* (2013.01); *H05K 3/10* (2013.01); *Y10T 29/49155* (2015.01); *H05K 1/02* (2013.01); *H05K 3/00* (2013.01); *H05K 3/06* (2013.01); *H05K 3/26* (2013.01)

(58) Field of Classification Search
USPC .............................. 174/255–259; 29/846, 847
See application file for complete search history.

(56) References Cited

U.S. PATENT DOCUMENTS

| | | | | |
|---|---|---|---|---|
| 2003/0000734 | A1* | 1/2003 | Nakagawa | 174/250 |
| 2003/0177635 | A1* | 9/2003 | Arrington et al. | 29/830 |
| 2010/0206628 | A1* | 8/2010 | Matsui et al. | 174/389 |
| 2011/0253422 | A1* | 10/2011 | Muramatsu et al. | 174/251 |
| 2012/0273262 | A1* | 11/2012 | Chu | 174/256 |
| 2012/0281375 | A1* | 11/2012 | Hsu | 361/761 |
| 2012/0298497 | A1* | 11/2012 | Maeda et al. | 200/600 |

FOREIGN PATENT DOCUMENTS

| | | |
|---|---|---|
| TW | 583688 B | 4/2004 |
| TW | I275344 B | 3/2007 |
| TW | I302083 B | 10/2008 |

* cited by examiner

*Primary Examiner* — Hoa C Nguyen
(74) *Attorney, Agent, or Firm* — Novak Druce Connolly Bove + Quigg LLP (57) ABSTRACT

This disclosure relates to a printed circuit board comprising a light-pervious insulation layer, a patterned electrically conductive layer and a light-pervious overlay. The patterned electrically conductive layer includes a first black oxide layer, a copper layer and a second black oxide layer. The copper layer includes two opposite surfaces and a plurality of inner surfaces interconnecting the two opposite surfaces of the copper layer. The first black oxide layer is formed on one of the surfaces, and the second black oxide layer is formed on the other surface and the inner surfaces. The patterned electrically conductive layer is arranged on the light-pervious insulation layer. The light-pervious overlay is arranged on the second black oxide layer. A method for manufacturing the printed circuit board is also provided in this disclosure.

8 Claims, 8 Drawing Sheets

METHOD FOR MANUFACTURING PRINTED CIRCUIT BOARD WITH PATTERNED ELECTRICALLY CONDUCTIVE LAYER THEREIN VISIBLE

BACKGROUND

1. Technical Field

The present disclosure relates to a printed circuit board with a patterned electrically conductive layer therein visible and a method for manufacturing the same.

2. Description of Related Art

A printed circuit board with a patterned electrically conductive layer visible includes a light-pervious insulation layer, a patterned electrically conductive layer formed on the light-pervious insulation layer, and a light-pervious overlay covering the patterned electrically conductive layer. A material of the patterned electrically conductive layer is copper. Opposite surfaces of the patterned electrically conductive layer are blackened through a black oxide treatment. The black color of the patterned electrically conductive layer seen through the light-pervious insulation layer and overlay causes the printed circuit board to have a remarkable appearance. A method of related art for manufacturing the printed circuit board may include steps as follows: firstly, a copper clad laminate is provided. The copper clad laminate comprises the light-pervious insulation layer and a copper foil with opposite surfaces oxidized to be black. Secondly, the copper foil is partly etched to form the patterned electrically conductive layer. Finally, the overlay is laminated over the patterned electrically conductive layer to form the printed circuit board.

However, inner surfaces of the patterned electrically conductive layer are defined interconnecting the two opposite surfaces after the etching process. The inner surfaces of the patterned electrically conductive layer present a red brown color because parts of the copper foil have been etched to expose the inner copper layer of the copper foil. This may cause an aesthetically-unacceptable appearance of the patterned electrically conductive layer.

What is needed therefore is a printed circuit board with a patterned electrically conductive layer visible and a method for manufacturing the same to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Embodiments will be described with reference to the drawings.

FIGS. 1-8 show a method for manufacturing a printed circuit board with a patterned electrically conductive layer visible. The method includes the following steps.

Figure 1:
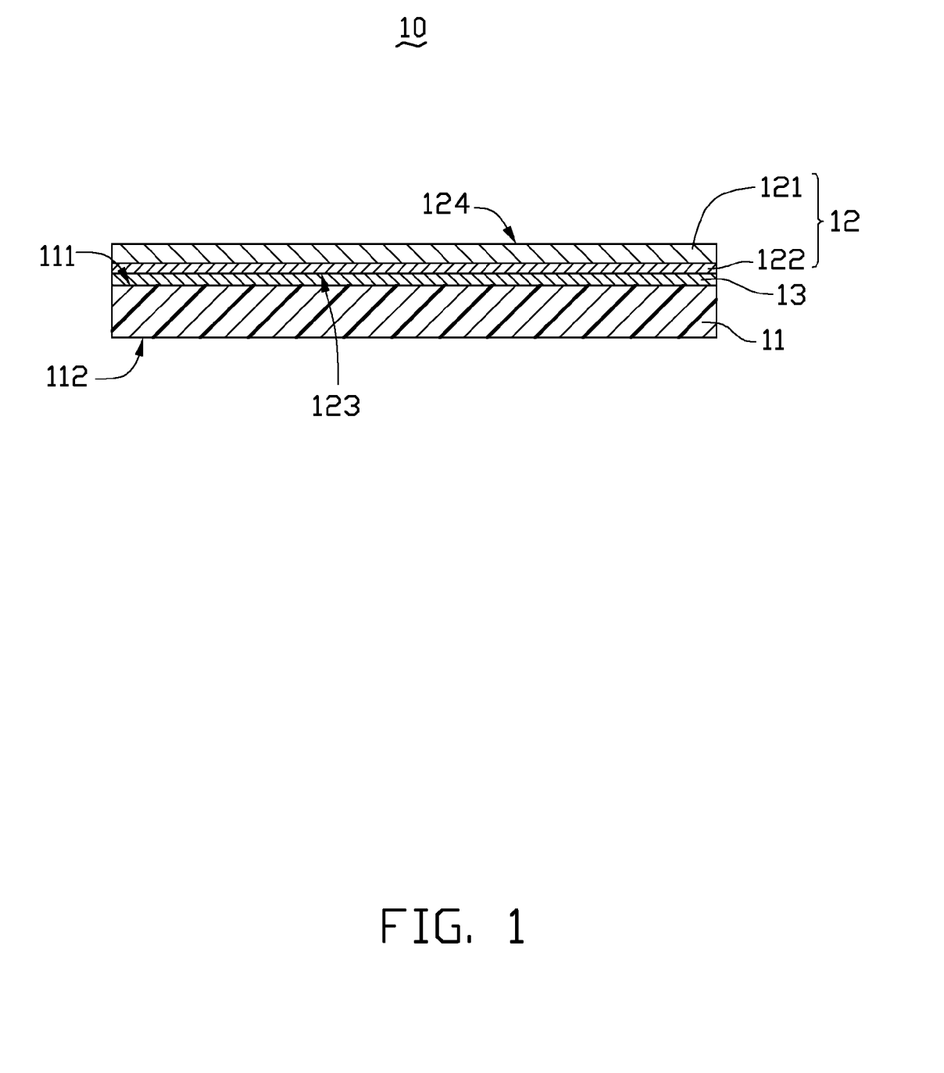
FIG. 1 is a cross-sectional view of a copper clad laminate in accordance with an exemplary embodiment, comprising a light-pervious insulation layer and a copper foil with a surface adjacent to the light-pervious insulation layer being black.

Step (1): FIG. 1 shows a copper clad laminate 10 comprising a light-pervious insulation layer 11, a copper foil 12, and an adhesive layer 13 sandwiched between the light-pervious insulation layer 11 and the and the copper foil 12. The copper foil 12 is fixed to the light-pervious insulation layer 11 through the adhesive layer 13.

A material of the light-pervious insulation layer 11 can be a flexible resin, such as polyimide (PI), polyethylene terephtalate (PET), and polythylene naphthalate (PEN), or a rigid resin. The light-pervious insulation layer 11 has a first surface 111 and an opposite second surface 112. One side of the copper foil 12 adjacent to the light-pervious insulation layer 11 is treated with a black oxide treatment to form a first black oxide layer 122, and the other side thereof is a copper layer 121. The copper foil 12 has a first surface 123 on the first black oxide layer 122, and an opposite second surface 124 defined on the copper layer 121. The adhesive layer 13 is light-pervious, and can be selected from the group consisting of epoxy resin, acrylic resin and any mixture thereof. Opposite surfaces of the adhesive layer 13 adhere to the first surface 111 of the light-pervious insulation layer 11 and the first surface 123 of the copper foil 12. The adhesive layer 13 can also be omitted if the copper foil 12 is directly laminated on the light-pervious insulation layer 11.

Figure 2:
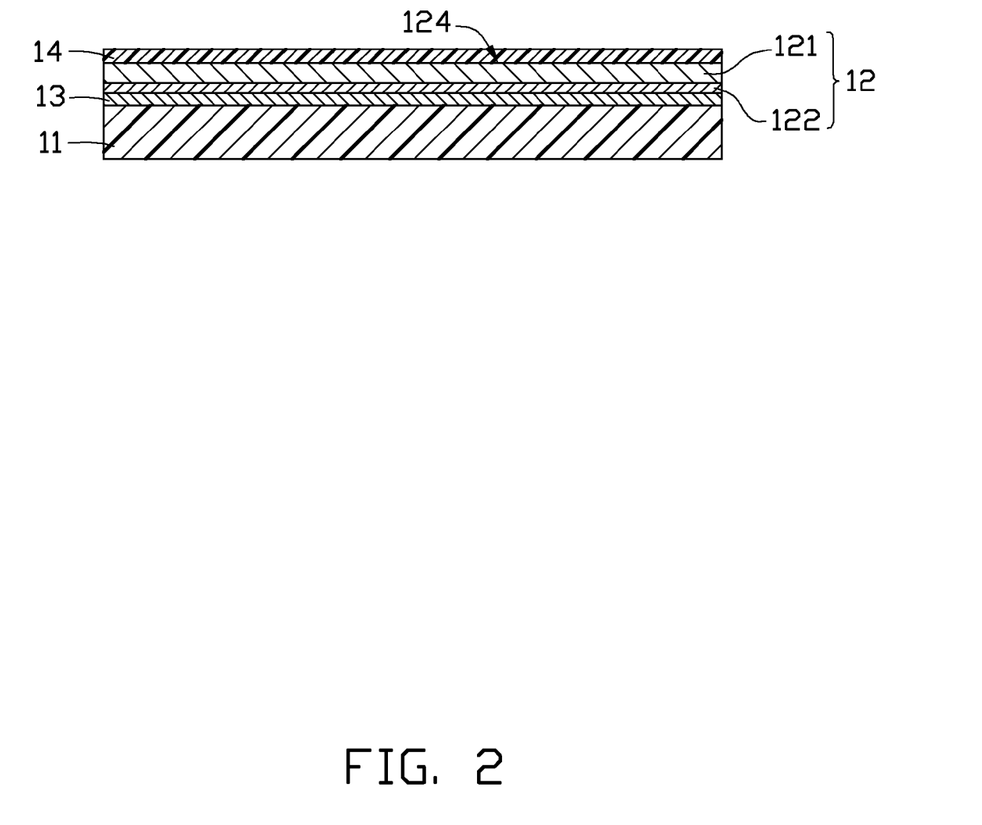
FIG. 2 shows a dry film coated on the copper clad laminate of FIG. 1.

Step (2): FIG. 2 shows an etch-resistant coating 14 formed on the second surface 124 of the copper foil 12. The etch-resistant coating 14 covers the entire second surface 124 of the copper foil 12. In this embodiment, the etch-resistant coating 14 is a dry-film type. The etch-resistant coating 14 can also be a wet-film type.

Figure 3:
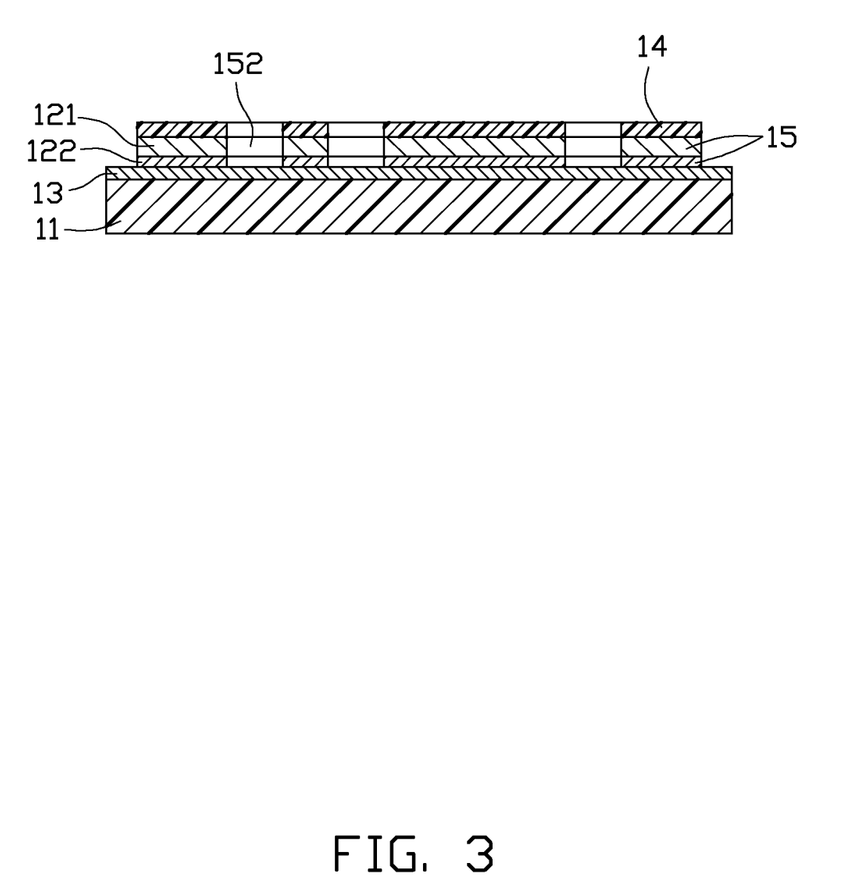
FIG. 3 shows the copper foil partly etched to convert the copper foil into a patterned electrically conductive layer of FIG. 2.
Figure 4:
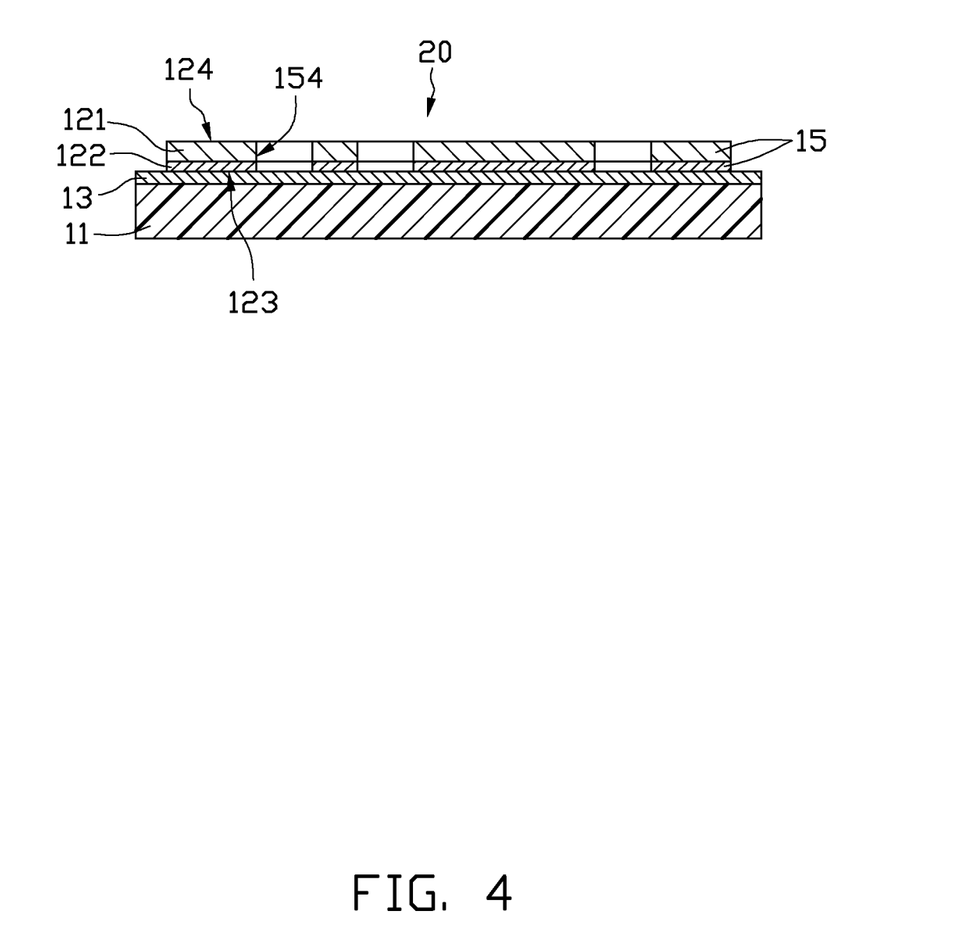
FIG. 4 shows the dry film of FIG. 3 stripped.

Step (3): FIGS. 3-4 show that the copper foil 12 is etched to be converted into a patterned electrically conductive layer 15, thereby obtaining a preformed circuit board 20. A method of forming the patterned electrically conductive layer 15 includes the following steps:

At first, the etch-resistant coating 14 is exposed to UV light and then developed to obtain a patterned etch-resistant coating 14 with a plurality of openings. Then the copper foil 12 is etched from the openings of the patterned etch-resistant coating 14 to convert the copper foil 12 into the patterned electrically conductive layer 15. A plurality of openings 152 aligned with the openings of the patterned etch-resistant coating 14 are defined in the patterned electrically conductive layer 15. Finally, the remaining etch-resistant coating 14 is stripped from the patterned electrically conductive layer 15. The patterned electrically conductive layer 15 defines a plurality of inner surfaces 154 in the openings 152. A part of the inner surfaces 154 corresponding to the copper layer 121 presents a red brown copper color, and the other part of the inner surfaces 154 corresponding to the first black oxide layer 122 presents a black color.

Figure 5:
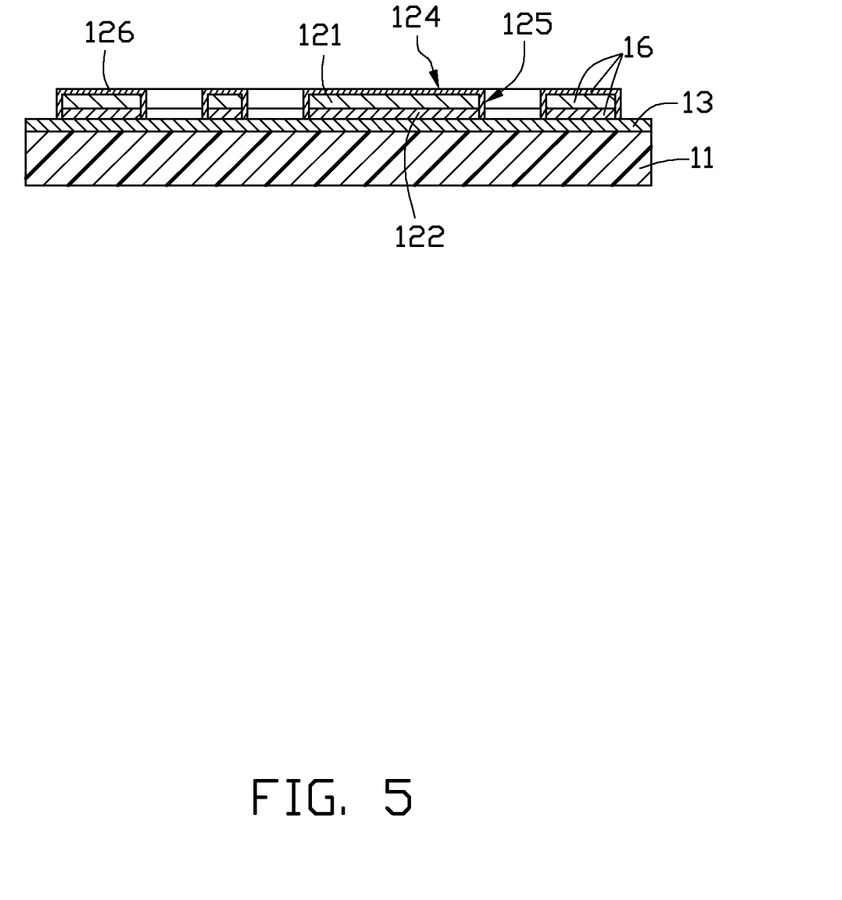
FIG. 5 shows a surface and inner surfaces of the patterned electrically conductive layer blackened through a black oxide treatment.
Figure 6:
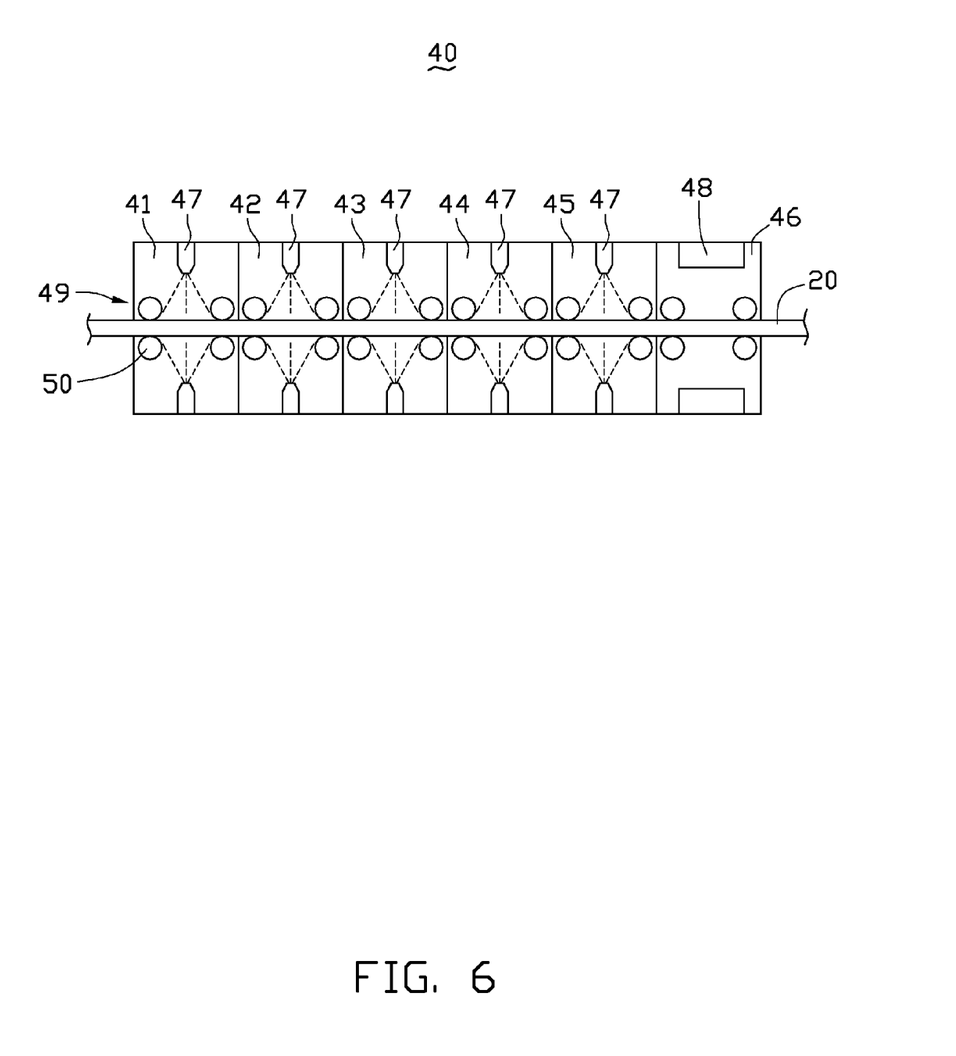
FIG. 6 shows a black oxidation line used in the black oxide treatment for blackening the patterned electrically conductive layer of FIG. 5.

Step (4): FIG. 5 shows a second black oxide treatment layer 126 formed on the second surface 124 and inner surfaces 154 of the patterned electrically conductive layer 15 by means of a black oxide treatment. The black oxide treatment can be done in a production line of black oxidation line 40 for applying black oxidation as shown in FIG. 6.

The black oxidation line 40 includes a cleaning room 41, a micro-etch room 42, a pre-immersing room 43, a blackening room 44, a reduction room 45 and a drying room 46 sequentially arranged in that order. A plurality of nozzles 47 are arranged in each of the cleaning room 41, the micro-etch room 42, the pre-immersing room 43, the blackening room 44 and the reduction room 45. In this embodiment, each of the cleaning room 41, the micro-etch room 42, the pre-immersing room 43, the blackening room 44 and the reduction room 45 has a nozzle 47 at top portion and a nozzle at bottom portion thereof. A plurality of driers are arranged in the drying room 46. In this embodiment, the driers include two air pressure guns 48 for blowing hot air, positioned at the top and the bottom portions in the drying room 46.

The black oxidation line 40 further includes a board driving device 49 to drive the preformed circuit board 20 to move through the cleaning room 41, the micro-etch room 42, the pre-immersing room 43, the blackening room 44, the reduction room 45 and the drying room 46. The board driving device 49 includes a plurality of drive rollers 50 arranged in an upper row of drive rollers 50 and also a lower row of drive rollers 50. Rotational axes of the drive rollers 50 are horizontal and are perpendicular to the extension directions of the upper row and the lower row. The drive rollers 50 in the upper row are aligned with the drive rollers 50 in the lower row. In this embodiment, each of the cleaning room 41, the micro-etch room 42, the pre-immersing room 43, the blackening room 44 and the reduction room 45 has two drive rollers 50 of the upper row and two drive rollers 50 of the lower row arranged therein and between the nozzles 47 at the top and bottom portions thereof, and the drying room 46 has two drive rollers 50 of the upper row and drive rollers 50 of the lower row arranged therein and between the air pressure guns 48. In this step, the preformed circuit board 20 is placed between the drive rollers 50 of the upper row and the drive rollers 50 of the lower row, and is in contact with the driver rollers 50 of the upper row and lower row. The drive rollers 50 are driven to rotate by a motor. The preformed circuit board 20 is carried through the cleaning room 41, the micro-etch room 42, the pre-immersing room 43, the blackening room 44, the reduction room 45 and the drying room 46 through the rotation of the drive rollers 50.

The black oxide treatment for forming the second black oxide treatment layer 126 using the black oxidation line 40 includes the following steps:

Firstly, the preformed circuit board 20 is carried into the cleaning room 41 by the drive rollers 50. A cleaning solution from the nozzles 47 in the cleaning room 41 is sprayed onto the preformed circuit board 20 to clean the preformed circuit board 20. The cleaning solution can be an alkaline solution comprising an alkaline cleaner, for example, QY-1302 (a product made by WMG group), wherein an amount by weight of the alkaline cleaner QY-1302 in the cleaning solution is in the range from 8% to 12%. A temperature of the cleaning room 41 is in the range from 45° C. to 55° C. A hydraulic pressure of cleaning solution from the nozzles 47 is in the range from 1.5 kg/cm$^2$ to 2.5 kg/cm$^2$. A time period for cleaning the preformed circuit board 20 in the cleaning room 41 is in the range from 30 seconds to 60 seconds.

Secondly, the preformed circuit board 20 is moved into the micro-etch room 42 from the cleaning room 41 by the drive rollers 50. An etchant is sprayed from the nozzles 47 in the micro-etch room 42 onto the preformed circuit board 20 to micro-etch the second surface 124 and the inner surfaces 154 the preformed circuit board 20, thereby roughening the second surface 124 and inner surfaces 154 of the patterned electrically conductive layer 15 rough. The etchant can be a mixed solution comprising sodium persulfate (SPS) and sulfuric acid ($H_2SO_4$), wherein a concentration of the sodium persulfate is in the range from 80 g/L to 100 g/L, and an amount by weight of the sulfuric acid in the etchant is about 2%. A temperature of the micro-etch room 42 is in the range from 35° C. to 40° C. A hydraulic pressure of etchant from the nozzles 47 in the micro-etch room 42 is in the range from 1.5 kg/cm$^2$ to 2.5 kg/cm$^2$. A time period for micro-etching the preformed circuit board 20 in the micro-etch room 42 is in the range from 30 seconds to 60 seconds.

Thirdly, the preformed circuit board 20 is moved into the pre-immersing room 43 from the micro-etch room 42. An activation solution is sprayed from the nozzles 47 in the pre-immersing room 43, thereby activating the second surface 124 and inner surfaces 154 of the patterned electrically conductive layer 15 to improve adhesive efficiency and quality of blackening in the blackening room 44. In this embodiment, the activation solution includes a pre-dip, for example, BX-730 (a product made by Hurricane Co. Ltd). with 4% to 6% by weight in the activation solution. A temperature of the pre-immersing room 43 is in the range from 25° C. to 35° C. A hydraulic pressure of activating solution from the nozzles 47 in the pre-immersing room 43 is in the range from 1.0 kg/cm$^2$ to 2.0 kg/cm$^2$. A time period for the application of the activation solution in the pre-immersing room 43 is in the range from 15 seconds to 35 seconds.

Fourthly, the preformed circuit board 20 is moved into the blackening room 44 from the pre-immersing room 43. A black oxide treating solution from the nozzles 47 in the blackening room 44 is sprayed onto the preformed circuit board 20 to blacken the second surface 124 and inner surfaces 154 of the patterned electrically conductive layer 15. The black oxide treating solution can be a mixture comprising a black oxide agent, for example, BX-750 (a product made by Hurricane Co. Ltd.) and the pre-dip BX-730, wherein an amount by weight of the black oxide agent BX-750 in the mixed solution is about 28%, and an amount by weight of the pre-dip BX-730 in the mixed solution is about 8%. A temperature of the blackening room 44 is in the range from 55° C. to 70° C. A hydraulic pressure of black oxide treating solution from the nozzles 47 in the blackening room 44 is in the range from 1.0 kg/cm$^2$ to 2.0 kg/cm$^2$. A time period for the black oxide treating solution in the blackening room 44 is in the range from 5 minutes to 7 minutes. In this step, a chemical reaction takes place between the copper in the second surface 124 and inner surfaces 154 of the patterned electrically conductive layer 15 and the black oxide treating solution, converting part of the copper layer 121 in the second surface 124 and inner surfaces 154 of the patterned electrically conductive layer 15 into a second black oxide layer 126, comprised of copper oxide and cuprous oxide. In other words, the patterned electrically conductive layer 15 is converted into a patterned electrically conductive layer 16 comprising the first black oxidation layer 122, the second black oxide layer 126 and the copper layer 121 itself encapsulated in the first black oxidation layer 122.

Fifthly, the preformed circuit board 20 is moved into the reduction room 45 from the blackening room 44. A reductant is applied from the nozzles 47 in the reduction room 45 onto the preformed circuit board 20 to deoxidize and remove the remaining black oxide treating solution on the preformed circuit board 20. The reductant can be a mixed solution comprising a reducer, for example, BX-770 (a product made by Hurricane Co. Ltd.) and the pre-dip BX-730, wherein an amount by weight of the reducer BX-770 in the mixed solution is about 3%, and an amount by weight of the pre-dip BX-730 in the mixed solution is about 3%. A temperature of the reduction room 45 is in the range from 22° C. to 28° C. A hydraulic pressure of reductant ejected from the nozzles 47 in the reduction room 45 is about 1.5 kg/cm$^2$. A time period for applying the reductant in the reduction room 45 is in the range from 5 minutes to 7 minutes. In this step, any remaining fluids on the surfaces of the preformed circuit board 20 are also removed.

Sixth, the preformed circuit board 20 is moved into the drying room 46 from the reduction room 45. The air pressure guns 48 blow hot air onto surfaces of the preformed circuit board 20 to dry the preformed circuit board 20. In an alternative embodiment, the preformed circuit board 20 can also be dried through baking.

The second surface 124 and inner surfaces 154 of the patterned electrically conductive layer 15 can also be blackened through conventional methods already known in the field of manufacturing a printed circuit board.

Figure 7:
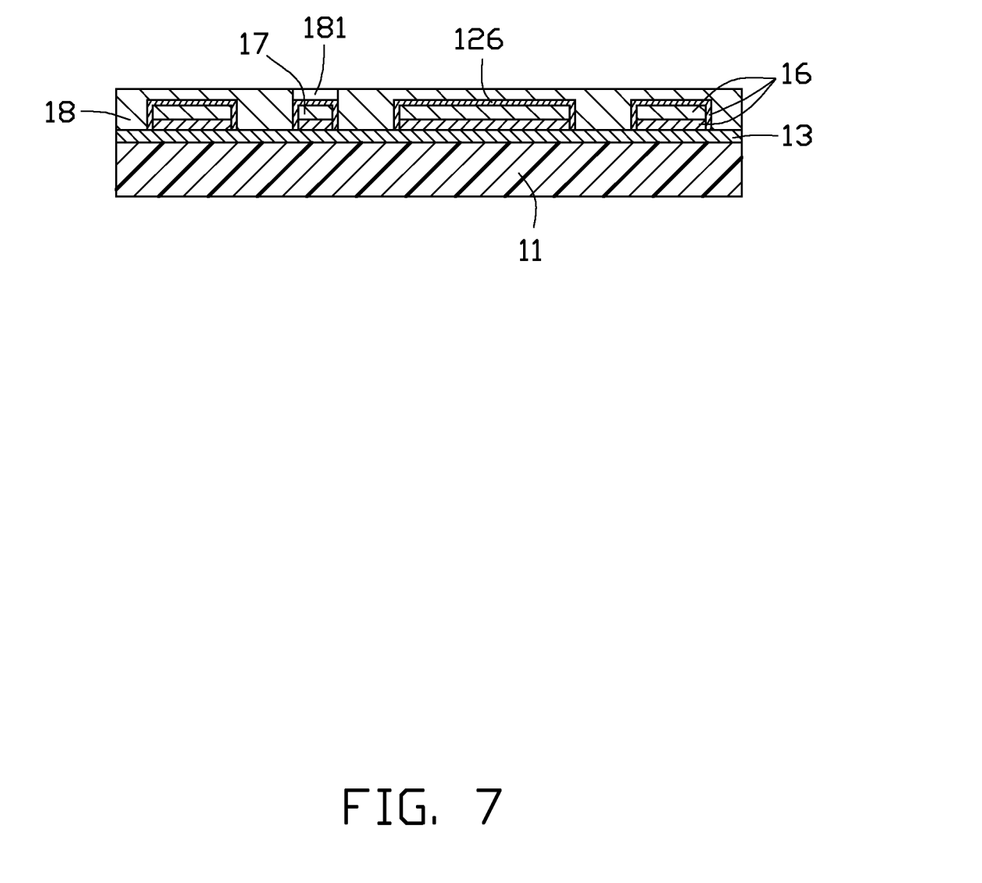
FIG. 7 shows a solder mask layer covering over the patterned electrically conductive layer, a portion of the patterned electrically conductive layer being exposed to an opening of the solder mask layer and serving as an electrically conductive pad.

Step (5): FIG. 7 shows that a light-pervious overlay 18 is laminated over the patterned electrically conductive layer 16 and adhesive layer 13 exposed to the patterned electrically conductive layer 16. An opening 181 is defined in the light-pervious overlay 18 to expose a part of the patterned electrically conductive layer 16. The part of patterned electrically conductive layer 16 exposed to the opening 181 serves as an electrically conductive pad 17.

A material of the light-pervious overlay 18 can be a flexible resin, such as polyimide (PI), polyethylene terephtalate (PET), and polythylene naphthalate (PEN), or a rigid resin. The opening 181 can be formed through drilling or laser etching. The number of the opening 181 can also be more than one.

Figure 8:
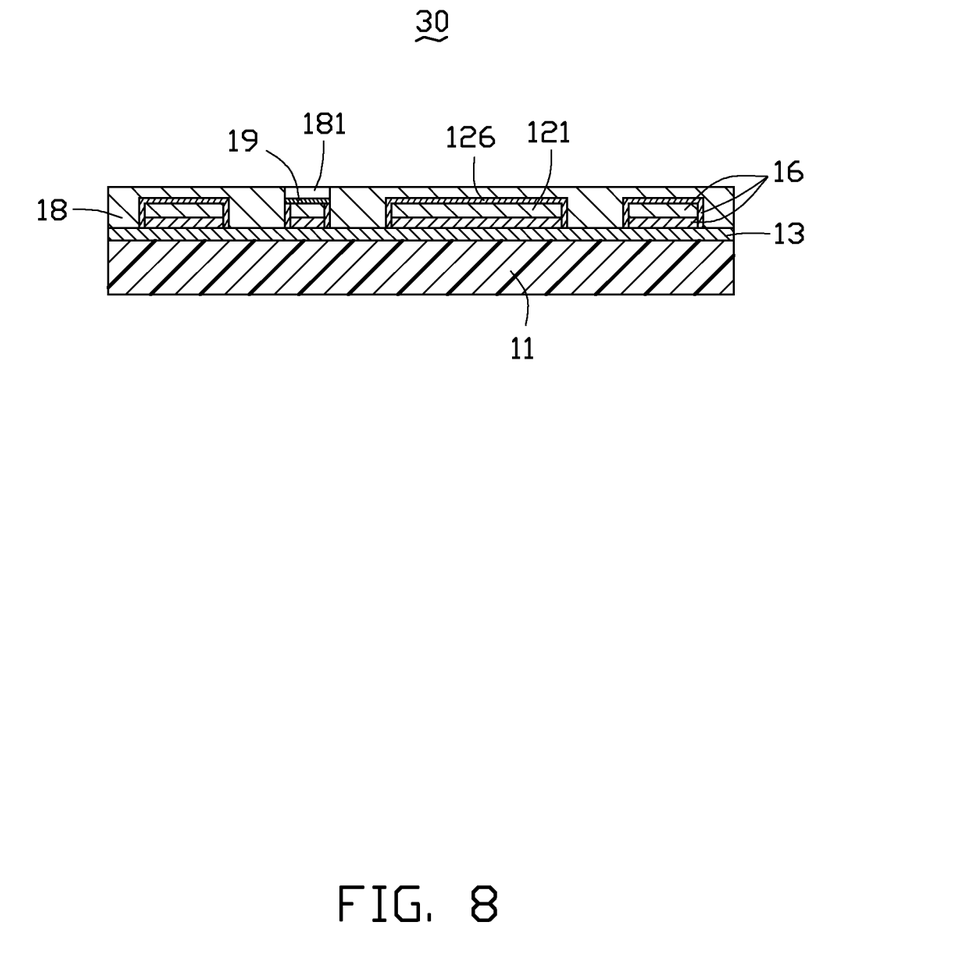
FIG. 8 shows a surface plating layer formed on the electrically conductive pad.

Step (6): FIG. 8 shows that the second black oxide layer 126 of the electrically conductive pad 17 is removed to expose a part of the copper layer 121 in the opening 181, and a surface plating layer 19 is formed on the copper layer 121 in the opening 181 by gold plating, thereby protecting the electrically conductive pad 17 from further oxidation and to facilitate an easy and good electrical connection between the electrically conductive pad 17 and an element or component. Thus, a circuit board 30 with the patterned electrically conductive layer 16 visible is obtained.

The surface plating layer 19 can also be formed by nickel gold plating, nickel palladium gold plating, or tin plating. The light-pervious overlay 18 can also cover the entire surface of the patterned electrically conductive layer 16 and if so the surface plating layer 19 can be omitted.

The method of steps (1)-(6) can be a roll-to-roll process. In this case, the circuit board 30 includes a plurality of circuit board pieces connected end to end. A cutting step, by machine or by laser beam, is then included to separate the endless length of circuit board 30 into circuit board pieces.

In this embodiment, the surfaces and inner surfaces of the patterned electrically conductive layer 16 all present a black, aesthetically-acceptable color.

While certain embodiments have been described and exemplified above, various other embodiments from the foregoing disclosure will be apparent to those skilled in the art. The present disclosure is not limited to the particular embodiments described and exemplified, but is capable of considerable variation and modification without departure from the scope and spirit of the appended claims.

The invention claimed is:

1. A method for manufacturing a printed circuit board with a patterned electrically conductive layer visible, comprising:
    providing a copper clad laminate comprising a light-pervious insulation layer and a copper foil, the copper foil comprising a copper layer and a first black oxidation layer formed on one side of the copper layer, the copper foil having a first surface on the first black oxidation layer, and an opposite second surface on the copper layer, the first surface of the copper foil being adjacent to the light-pervious insulation layer;
    etching the copper foil to convert the copper foil into a first patterned electrically conductive layer, the first patterned electrically conductive layer comprising a plurality of first openings to expose parts of the light-pervious insulation layer, thus the copper foil defining a plurality of inner surfaces interconnecting the first and second surfaces in the first openings, thereby obtaining a preformed circuit board;
    blackening the inner surfaces and the second surface of the first patterned electrically conductive layer to form a second patterned electrically conductive layer comprising the first black oxidation layer, a second black oxidation layer and the copper layer encapsulated in the first and second black oxidation layers;
    wherein a method for blackening the inner surfaces and the second surfaces of the first patterned electrically conductive layer comprises:
    cleaning the second surface and the inner surfaces of the first electrically conductive layer;
    micro-etching the second surface and the inner surfaces to roughen the second surface and the inner surfaces; and
    black oxidation treatment of the second surface and the inner surfaces to blacken the second surface and the inner surfaces, thereby obtaining the second patterned electrically conductive layer; and
    laminating a light-pervious overlay onto the second patterned electrically conductive layer, thereby obtaining a printed circuit board with the second patterned electrically conductive layer visible.

2. The method of claim 1, wherein the copper clad laminate further comprises an adhesive layer arranged between the light-pervious insulation layer and the copper foil, the copper foil being fixed to the light-pervious insulation layer through the adhesive layer.

3. The method of claim 1, wherein a method for blackening the inner surfaces and the second surfaces of the first patterned electrically conductive layer comprises:
    providing a black oxidation line comprising a cleaning room, a micro-etch room, a pre-immersing room, a blackening room, a reduction room and a drying room sequentially arranged in that order, and a board driving device, a nozzle being arranged in each of the cleaning room, the micro-etch room, the pre-immersing room, the blackening room and the reduction room, a drier being arranged in the drying room, the board driving device configured for carrying the preformed circuit board through the cleaning room, the micro-etch room, the pre-immersing room, the blackening room, the reduction room and the drying room;
    carrying the preformed circuit board into the cleaning room using the board driving device, and spraying a cleaning solution onto the preformed circuit board to clean the preformed circuit board using the nozzle in the cleaning room;

carrying the preformed circuit board into the micro-etch room using the board driving device, and spraying an etchant onto the preformed circuit board to micro-etch the second surface and the inner surfaces to roughen the second surface and inner surfaces using the nozzle in the micro-etch room;

carrying the preformed circuit board into the pre-immersing room using the board driving device, spraying an activation solution onto the preformed circuit board to activate the second surface and inner surfaces using the nozzle in the pre-immersing room;

carrying the preformed circuit board into the blackening room using the board driving device, and spraying a black oxide treating solution onto the preformed circuit board to blacken the second surface and the inner surfaces using the nozzle in the blackening room, thereby obtaining the second patterned electrically conductive layer;

carrying the preformed circuit board into the reduction room using the board driving device, spraying a reductant onto the preformed circuit board using the nozzle in the reduction room to deoxidize and remove the remaining black oxide treating solution on the preformed circuit board;

and the board driving device carrying the preformed circuit board into the drying room, the drier in the drying room drying the preformed circuit board.

4. The method of claim 3, wherein the cleaning solution comprises an alkaline cleaner in the range from 8% to 12% by weight, a temperature of the cleaning room being in the range from 45° C. to 55° C., a hydraulic pressure of the cleaning solution from the nozzle in the cleaning room being in the range from 1.5 kg/cm$^2$ to 2.5 kg/cm$^2$, a time period for cleaning the preformed circuit board in the cleaning room being in the range from 30 seconds to 60 seconds; and the etchant is a mixed solution comprising sodium persulfate and sulfuric acid, wherein a concentration of the sodium persulfate is in the range from 80 g/L to 100 g/L, and an amount by weight of the sulfuric acid in the etchant is about 2%, a temperature of the micro-etch room being in the range from 35° C. to 40° C., a hydraulic pressure of etchant from the nozzle in the micro-etch room being in the range from 1.5 kg/cm$^2$ to 2.5 kg/cm$^2$, a time period for micro-etching the preformed circuit board in the micro-etch room being in the range from 30 seconds to 60 seconds;

the activation solution comprises a pre-dip in an amount of 4% to 6% by weight in the activation solution, a temperature of the pre-immersing room being in the range from 25° C. to 35° C., a hydraulic pressure of activating solution from the nozzle in the pre-immersing room is in the range from 1.0 kg/cm$^2$ to 2.0 kg/cm$^2$, a time period for the application of the activation solution in the pre-immersing room being in the range from 15 seconds to 35 seconds;

the black oxide treating solution is a mixture comprising black oxide agent and a pre-dip, wherein an amount by weight of the black oxide agent in the mixed solution is about 28%, and an amount by weight of the a pre-dip in the mixed solution is about 8%, a temperature of the blackening room being in the range from 55° C. to 70° C., a hydraulic pressure of black oxide treating solution from the nozzle in the blackening room being in the range from 1.0 kg/cm$^2$ to 2.0 kg/cm$^2$, a time period for the black oxide treating solution in the blackening room being in the range from 5 minutes to 7 minutes; and the reductant is a mixed solution comprising a reducer and a pre-dip, wherein an amount by weight of the reducer in the mixed solution is about 3%, and an amount by weight of the pre-dip in the mixed solution is about 3%, a temperature of the reduction room being in the range from 22° C. to 28° C., a hydraulic pressure of reductant from the nozzles in the reduction room 45 being about 1.5 kg/cm$^2$, a time period of applying the reductant in the reduction room being in the range from 5 minutes to 7 minutes.

5. The method of claim 4, wherein the drier is an air pressure gun, the air pressure gun configured for blowing hot air to dry the preformed circuit board.

6. The method of claim 1, wherein the light-pervious overlay defines an opening to expose a part of the second patterned electrically conductive layer, the exposed part of second patterned electrically conductive layer configured for serving as an electrically conductive pad.

7. The method of claim 6, further comprising: removing part of the second black oxide layer exposed in the opening of the light-pervious overlay to expose a part of the copper layer in the opening of the light-pervious overlay; forming a surface plating layer on the exposed part of the copper layer.

8. The method of claim 7, wherein a method of forming the surface plating layer is selected from the group consisting of gold plating, nickel gold plating, nickel palladium gold plating and tin plating.

* * * * *